United States Patent
Grannen et al.

(10) Patent No.: US 9,602,073 B2
(45) Date of Patent: *Mar. 21, 2017

(54) BULK ACOUSTIC WAVE RESONATOR HAVING PIEZOELECTRIC LAYER WITH VARYING AMOUNTS OF DOPANT

(71) Applicant: Avago Technologies General IP (Singapore) Pte. Ltd., Singapore (SG)

(72) Inventors: Kevin J. Grannen, Thornton, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 202 days.

This patent is subject to a terminal disclaimer.

(21) Appl. No.: 13/906,873

(22) Filed: May 31, 2013

(65) Prior Publication Data

US 2014/0354109 A1   Dec. 4, 2014

(51) Int. Cl.
*H03H 9/17* (2006.01)
*H03H 9/02* (2006.01)

(52) U.S. Cl.
CPC .... *H03H 9/02015* (2013.01); *H03H 9/02047* (2013.01); *H03H 9/02133* (2013.01); *H03H 9/171* (2013.01); *H03H 9/173* (2013.01); *H03H 9/175* (2013.01)

(58) Field of Classification Search
CPC ........... H03H 9/02015; H03H 9/02031; H03H 9/02047; H03H 9/02133; H03H 9/171–9/176; H03H 9/54; H03H 9/562; H03H 9/564; H03H 9/581–9/583; H03H 9/586–9/589

USPC .................................................. 333/187–189
See application file for complete search history.

(56) References Cited

U.S. PATENT DOCUMENTS

| | | | |
|---|---|---|---|
| 3,200,354 A | * | 8/1965 | White .......................... 257/416 |
| 5,587,620 A | | 12/1996 | Ruby et al. |
| 5,873,153 A | | 2/1999 | Ruby et al. |
| 6,107,721 A | | 8/2000 | Lakin |
| 6,384,697 B1 | | 5/2002 | Ruby |
| 6,441,539 B1 | * | 8/2002 | Kitamura ................. H03H 3/02 310/321 |
| 6,507,983 B1 | | 1/2003 | Ruby et al. |
| 6,709,776 B2 | | 3/2004 | Noguchi et al. |
| 6,936,837 B2 | | 8/2005 | Yamada et al. |
| 7,275,292 B2 | | 10/2007 | Ruby et al. |
| 7,280,007 B2 | | 10/2007 | Feng et al. |
| 7,358,831 B2 | | 4/2008 | Larson, III et al. |

(Continued)

OTHER PUBLICATIONS

A. Hagimura et al.; "Impurity Doping Effect on Electric Field Induced Strains in (Pb,Ba)(Zr,Ti)O3"; 1990 IEEE 7th Iternational Symposium on Applications in Ferroelectrics, Jun. 6-8, 1990, pp. 185-188 and a 1 page IEEE Xplore abstract.*

(Continued)

*Primary Examiner* — Barbara Summons (57) ABSTRACT

A bulk acoustic wave (BAW) resonator structure includes a first electrode disposed over a substrate, a piezoelectric layer disposed over the first electrode, and a second electrode disposed over the piezoelectric layer. The piezoelectric layer includes undoped piezoelectric material and doped piezoelectric material, where the doped piezoelectric material is doped with at least one rare earth element, for improving piezoelectric properties of the piezoelectric layer and reducing compressive stress.

21 Claims, 6 Drawing Sheets

(56) References Cited

U.S. PATENT DOCUMENTS

| | | | |
|---|---|---|---|
| 7,388,454 | B2 | 6/2008 | Ruby et al. |
| 7,629,865 | B2 | 12/2009 | Ruby |
| 7,758,979 | B2 | 7/2010 | Akiyama et al. |
| 8,575,819 | B1* | 11/2013 | Bhugra et al. ............... 310/318 |
| 2004/0212277 | A1* | 10/2004 | Stommer ..................... 310/320 |
| 2007/0205850 | A1 | 9/2007 | Jamneala et al. |
| 2009/0218912 | A1* | 9/2009 | Abd Allah et al. ........... 310/321 |
| 2010/0327697 | A1 | 12/2010 | Choy et al. |
| 2010/0327994 | A1 | 12/2010 | Choy et al. |
| 2011/0180391 | A1 | 7/2011 | Larson, III et al. |
| 2013/0127300 | A1 | 5/2013 | Umeda et al. |
| 2014/0125203 | A1* | 5/2014 | Choy et al. ................... 310/365 |

OTHER PUBLICATIONS

Morito Akiyama et al., "Preparation of scandium aluminum nitride thin films by using scandium aluminum alloy sputtering target and design of experiments", Journal of the Ceramic Society of Japan, 118, [12], 2010, pp. 1166-1169.

Milena Moreira et al., "Aluminum scandium nitride thin-film bulk acoustic resonators for wide band applications", vol. 86, Issue 1, Jul. 4, 2011, pp. 23-26.

Akiyama et al., "Enhancement of piezoelectric response in scandium aluminum nitride alloy thin films prepared by dual reactive cosputtering," Advanced Materials, 2009, vol. 21, pp. 593-596.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010, pp. 1-4.

Ranjan et al. "Strained Hexagonal ScN: A Material with Unusual Structural and Optical Properties," Physical Review Letters, Jun. 27, 2003, vol. 90, No. 25, The American Physical Society, USA, pp. 1-4.

Farrer et al., "Properties of hexagonal ScN versus wurtzite GaN and InN," Physical Review B, Nov. 20, 2002, vol. 66, No. 20, The American Physical Society, USA, pp. 1-4.

Constantin et al., "Composition-dependent structural properties in ScGaN alloy films: A combined experimental and theoretical study," Journal of Applied Physics, Dec. 16, 2005, vol. 98, No. 12, American Institute of Physics, USA, pp. 1-8.

Zhen Zhou et al., "Energetics and electronic structures of AlN nanotubes/wires and their potential application as ammonia sensors," Nanotechnology 18 (2007) 424023, pp. 1-8.

Marc-Alexandre Dubois et al., "Properties of aluminum nitride thin films for piezoelectric transducers and microwave filter applications", Applied Physics Letters, vol. 74, No. 20, May 17, 1999, pp. 1-3.

A. Kabulski et al., "Erbium Alloyed Aluminum Nitride Films for Piezoelectric Applications", Mater. Res. Soc. Symp. Proc. vol. 1129 © 2009 Materials Research Society, pp. 1-5.

Vincent Richard Pagan, "Aluminum Nitride Deposition / Characterization & PMEMS / Saw Device Simulation / Fabrication", Lane Department of Computer Science and Electrical Engineering Morgantown, West Virginia 2009, pp. 1-186.

* cited by examiner

BULK ACOUSTIC WAVE RESONATOR HAVING PIEZOELECTRIC LAYER WITH VARYING AMOUNTS OF DOPANT

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. For example, BAW resonators include thin film bulk acoustic resonators (FBARs), which include resonator stacks formed over a substrate cavity, and solidly mounted resonators (SMRs), which include resonator stacks formed over an acoustic reflector (e.g., Bragg mirror). The BAW resonators may be used for electrical filters and voltage transformers, for example.

Generally, an acoustic resonator has a layer of piezoelectric material between two conductive plates (electrodes), which may be formed on a thin membrane. The piezoelectric material may be a thin film of various materials, such as aluminum nitride (AlN), zinc oxide (ZnO), or lead zirconate titanate (PZT), for example. Thin films made of AlN are advantageous since they generally maintain piezoelectric properties at high temperature (e.g., above 400° C.). However, AlN has a lower piezoelectric coefficient $d_{33}$ than both ZnO and PZT, for example.

Figure 1:
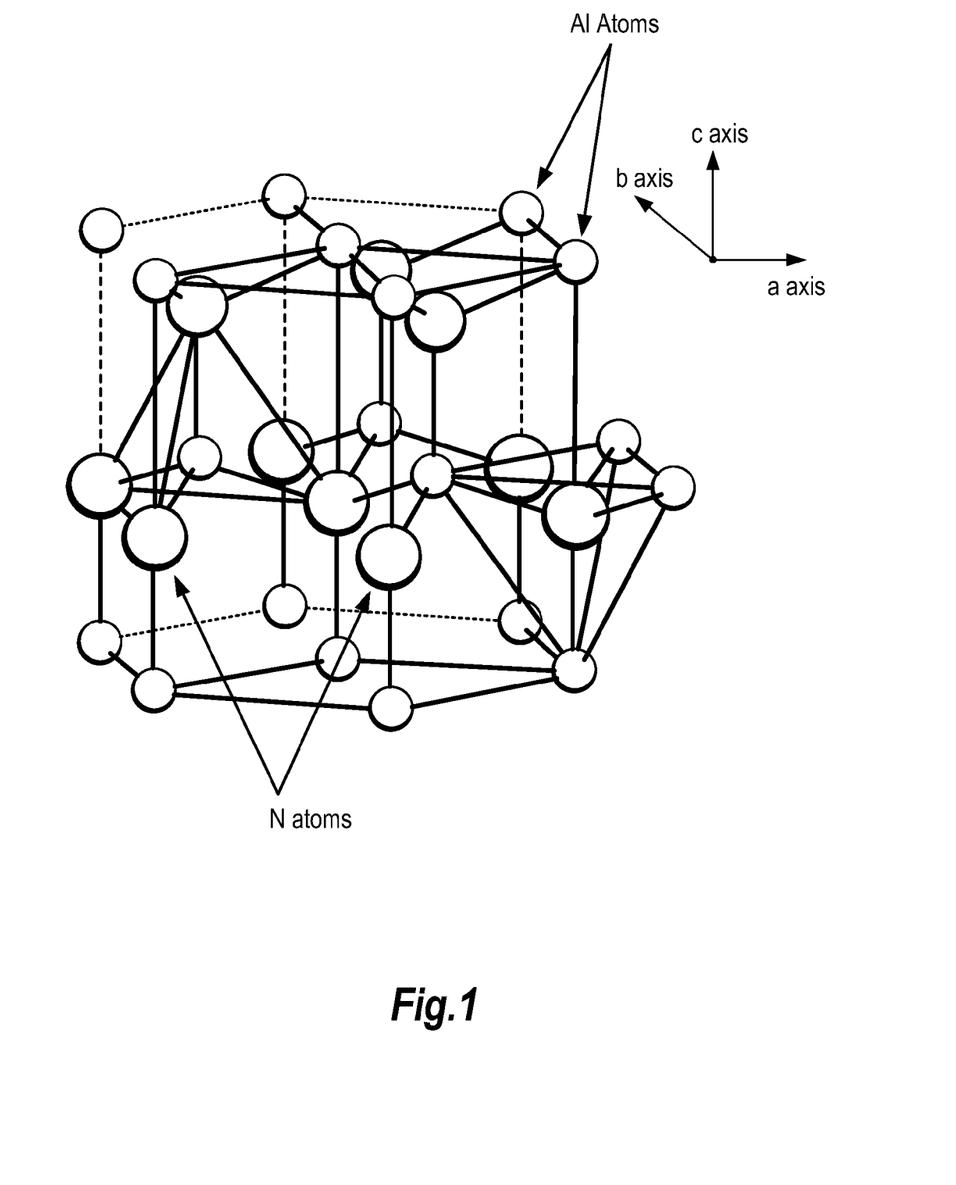
FIG. 1 is a perspective view of an illustrative model of a crystal structure of aluminum nitride (AlN).

An AlN thin film may be deposited with various specific crystal orientations, including a wurtzite (0001) B4 structure, which consists of a hexagonal crystal structure with alternating layers of aluminum (Al) and nitrogen (N), and a zincblende structure, which consists of a symmetric structure of Al and N atoms, for example. FIG. 1 is a perspective view of an illustrative model of the common wurtzite structure. Due to the nature of the Al—N bonding in the wurtzite structure, electric field polarization is present in the AlN crystal, resulting in the piezoelectric properties of the AlN thin film. To exploit this polarization and the corresponding piezoelectric effect, one must synthesize the AlN with a specific crystal orientation.

Referring to FIG. 1, the a-axis and the b-axis are in the plane of the hexagon at the top, while the c-axis is parallel to the sides of the crystal structure. For AlN, the piezoelectric coefficient $d_{33}$ along the c-axis is about 3.9 pm/V, for example. Generally, a higher piezoelectric coefficient $d_{33}$ is desirable, since the higher the piezoelectric coefficient $d_{33}$, the less material is required to provide the same piezoelectric effect. In order to improve the value of the piezoelectric coefficient $d_{33}$, some of the Al atoms may be replaced with a different metallic element, which may be referred to as "doping." For example, past efforts to improve the piezoelectric coefficient $d_{33}$ have included disturbing the stoichiometric purity of the AlN crystal lattice consistently throughout the entire piezoelectric layer by adding rare earth elements in place of some Al atoms.

SUMMARY

In accordance with a representative embodiment, a bulk acoustic wave (BAW) resonator structure includes a first electrode disposed over a substrate, a piezoelectric layer disposed over the first electrode, and a second electrode disposed over the first piezoelectric layer. The piezoelectric layer includes undoped piezoelectric material and doped piezoelectric material, the doped piezoelectric material being doped with at least one rare earth element, for improving piezoelectric properties of the piezoelectric layer and reducing compressive stress.

In accordance with another representative embodiment, a thin film bulk acoustic resonator (FBAR) structure includes a substrate defining a cavity, a first electrode disposed over the substrate, a piezoelectric layer disposed over the first electrode, and a second electrode disposed over the piezoelectric layer. At least a portion of the first electrode is formed over the cavity in the substrate. The piezoelectric layer includes an undoped sub-layer formed of undoped aluminum nitride (AlN) material and a first doped sub-layer formed of first doped AlN material, the first doped AlN material being doped with a first atomic percentage of a rare earth element.

In accordance with another representative embodiment, a solidly mounted resonator (SMR) structure includes a substrate, an acoustic reflector formed on the substrate, a first electrode disposed over the acoustic reflector, a piezoelectric layer disposed over the first electrode, and a second electrode disposed over the piezoelectric layer. The acoustic reflector includes a plurality of acoustic impedance layers, where at least two of the acoustic impedance layers have different acoustic impedances. The piezoelectric layer includes an undoped sub-layer formed of undoped AlN material and a first doped sub-layer formed of first doped AlN material, the first doped AlN material being doped with a first atomic percentage of a rare earth element.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator devices that may provide various filters (e.g., ladder filters), and other devices. Certain details BAW resonators, including FBARs, SMRs and resonator filters, materials thereof and their methods of fabrication may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; and U.S. Patent App. Pub. No. 2010/0327994 to Choy et al. The entire contents of these patents and patent applications are hereby incorporated by reference. It is emphasized that the components, materials and method of fabrication described in these patents and patent applications are representative and other methods of fabrication and materials within the purview of one of ordinary skill in the art are contemplated.

Various embodiments relate to providing a thin film of piezoelectric material (piezoelectric layer), such as AlN, with an enhanced piezoelectric coefficient $d_{33}$ and an enhanced electromechanical coupling coefficient $kt^2$ by incorporating one or more rare earth elements into the crystal lattice of a portion of the piezoelectric layer. That is, the piezoelectric layer may include multiple sub-layers, where at least one sub-layer is formed of stoichiometric AlN material (undoped AlN sub-layer) and at least one other sub-layer is formed of AlN material doped with a rare earth element (doped AlN sub-layer). Alternatively, the piezoelectric layer may be a single layer including different (e.g., graduated) levels of doping throughout the thickness of the piezoelectric layer. For example, the atomic percentage of a rare earth element may gradually change over the thickness of the piezoelectric layer. For example, the piezoelectric layer may include undoped AlN material at the bottom with gradually increasing atomic percentages of a rare earth element being added over the thickness of the piezoelectric layer. By incorporating specific atomic percentages of the multiple rare earth elements, the piezoelectric properties of the AlN, including piezoelectric coefficient $d_{33}$ and enhanced electromechanical effective coupling coefficient $kt^2$, are improved as compared to entirely stoichiometric (undoped) AlN. Also, presence of the undoped portion of the piezoelectric layer provides mechanical stability, preventing bowing, for example, as discussed with reference to FIGS. 2A and 2B.

As mentioned above, AlN material may be doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material.

Also, a thin film of piezoelectric material, such as AlN, deposited on a substrate (e.g., forming a piezoelectric layer) may be in a tensile state of stress or a compressive state of stress. The stress state of the thin film is determined, in part, by deposition conditions and the substrate. For example, applying a negative potential to the substrate results in positive ions from the plasma bombarding the growing film, causing the film to exhibit compressive stress. This compressive stress arises from the "peening" effect of the bombarding ions.

Figure 2A:
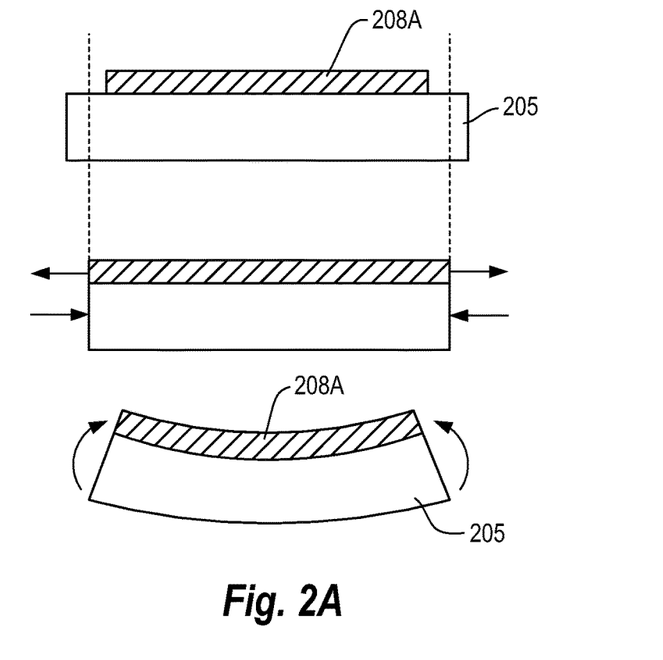
FIGS. 2A and 2B are cross-sectional views of a representative thin film on a substrate subject to tensile and compressive stresses, respectively.
Figure 2B:
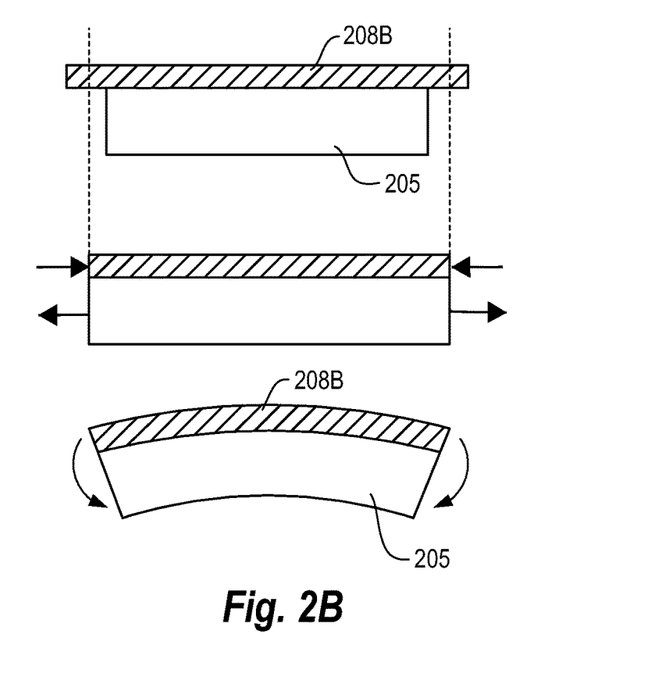

FIGS. 2A and 2B are cross-sectional views of representative thin films on a substrate. Thin film 208A deposited on substrate 205 exhibits tensile stress in FIG. 2A, indicated by outwardly pointing arrows, and thin film 208B deposited on substrate 205 exhibits compressive stress in FIG. 2B, indicated by inwardly pointing arrows. Tensile stress results in the substrate 205 bowing upward, while compressive stress results in the substrate 205 bowing downward. If the thin films 208A, 208B and substrate 205 were separated, and the thin films 208A, 208B were allowed to relax into its unstressed state, the thin film 208A would contract to be shorter than the lateral dimension of the substrate 205, as shown in the top depiction in FIG. 2A, and the thin film 208B would expand to be longer than the lateral dimension of the substrate 205, as shown in the top depiction in FIG. 2B. Generally, to make the thin films 208A, 208B match the dimension of the substrate 205, tensile stress needs to be applied to the thin film 208A that is smaller in lateral dimension than the substrate 205 and compressive stress needs to be applied to the thin film 208B that is larger than the substrate 205.

Generally, when AlN thin film is doped with a rare earth element, the compressive stress on the thin AlN film increases as the atomic percentage of the rare earth element increases. The increase in compressive stress may cause the wafer substrate on which the AlN thin film is formed to bow, e.g., as shown in FIG. 2B, to such a large degree that it cannot be processed through photolithography tools. Furthermore, the coupling coefficient $kt^2$ of doped AlN thin film depends, in part, on the amount of stress experienced by the AlN thin film. The coupling coefficient $kt^2$ generally varies linearly with the amount of stress in the doped AlN thin film, with roughly a 0.1 percent increase in the coupling coefficient $kt^2$ for every 100 MPa increase in the stress. Consequently, a uniform amount of stress across the wafer is desired. Otherwise, devices will not meet product specifications. In order to effectively utilize doped AlN thin films for constructing BAW devices, for example, the impact of the absolute level of the stress, as well as the variation of the stress across the wafer, should be minimized. This may be achieved by incorporating undoped and doped AlN within the thin film, as discussed below.

Figure 3A:
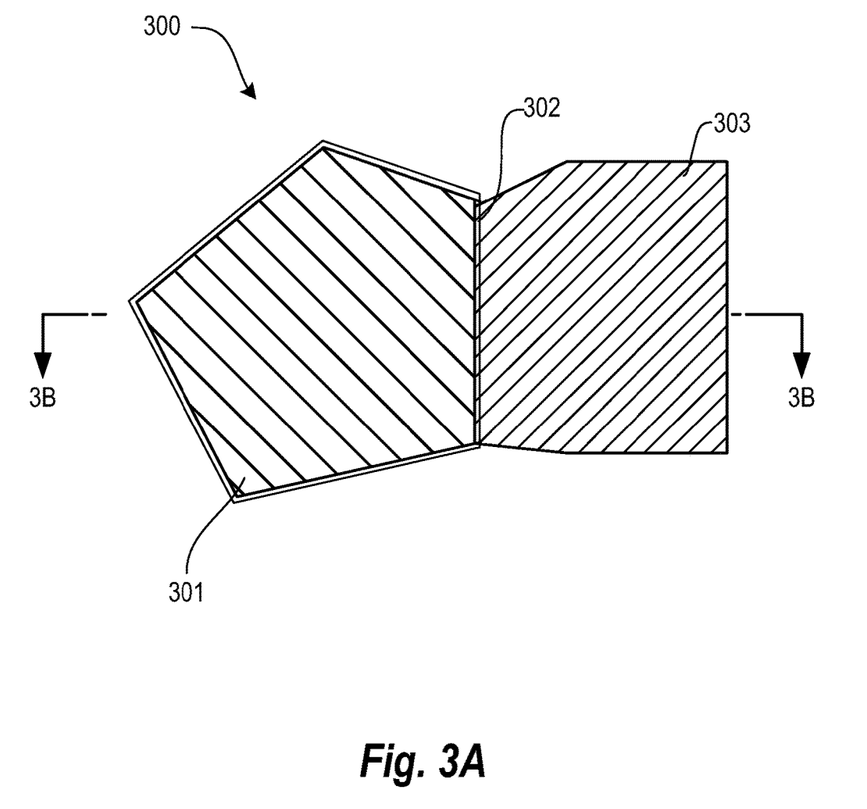
FIG. 3A shows a top-view of a thin film bulk acoustic resonator (FBAR) having a piezoelectric layer formed of undoped and doped sub-layers, in accordance with a representative embodiment.

FIG. 3A shows a top view of FBAR 300 in accordance with a representative embodiment. The FBAR 300 includes a top electrode 301 having five (5) sides, with a connection side 302 configured to provide an electrical connection to interconnect 303. The interconnect 303 provides electrical signals to the top electrode 301 to excite desired acoustic waves in a piezoelectric layer (not shown in FIG. 3) of the FBAR 300.

Figure 3B:
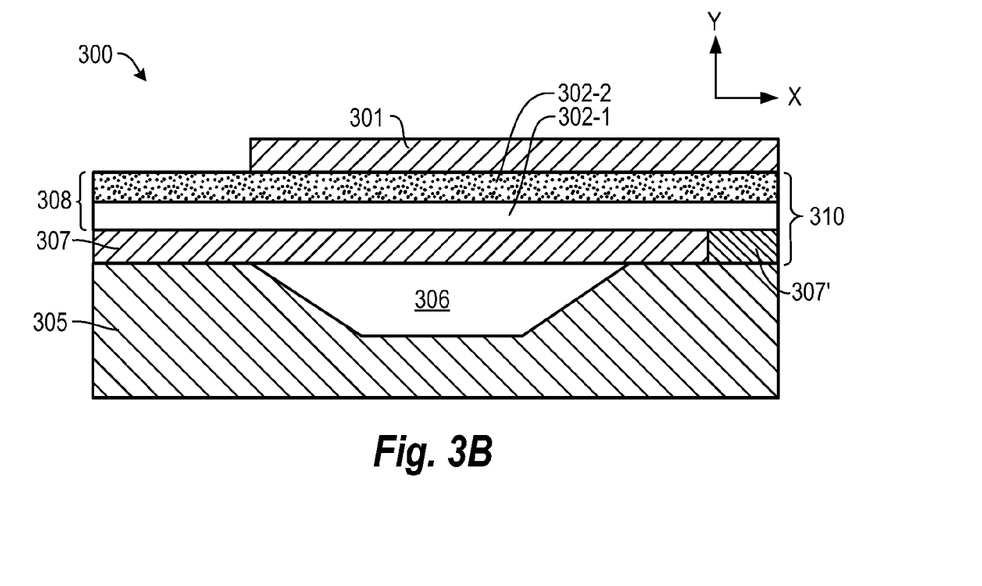
FIG. 3B is a cross-sectional view of the FBAR, taken along the line 3B-3B of FIG. 3A, having a piezoelectric layer formed of undoped and doped sub-layers, in accordance with a representative embodiment.

FIG. 3B shows a cross-sectional view of the FBAR 300 taken along line 3B-3B in accordance with a representative embodiment. The FBAR 300 includes acoustic stack 310 formed of multiple layers over substrate 305 (e.g., wafer) having a cavity 306. A first or bottom electrode 103 is disposed over the substrate 305, and extends over the cavity 306. A planarization layer 307' is also provided over the substrate as shown. In a representative embodiment, the planarization layer 307' includes non-etchable borosilicate glass (NEBSG), for example. In general, planarization layer 307' does not need to be present in the structure (as it increases overall processing cost), but when present, it may improve quality of growth of subsequent layers and simplify their processing. A piezoelectric layer 308 is disposed over the bottom electrode 307, and a second or top electrode 301 (shown in FIG. 3A) is disposed over the piezoelectric layer 308. As should be appreciated by one of ordinary skill in the art, the structure provided by the bottom electrode 307, the piezoelectric layer 308 and the top electrode 301 forms the acoustic stack 310 of a BAW resonator.

The substrate 305 may be formed of various types of materials, including semiconductor materials compatible with semiconductor processes, such as silicon (Si), gallium arsenide (GaAs), indium phosphide (InP), or the like, which is useful for integrating connections and electronics, thus reducing size and cost. Illustratively, the bottom electrode 307 and top electrode 301 are formed of tungsten (W) having a thickness of approximately 1000 Å to approximately 10000 Å. Other materials may be used for the bottom electrode 307 and the top electrode 301, including but not limited to molybdenum (Mo) or a bi-metal material. The cavity 306 may be formed using a sacrificial material, such as phosphosilicate glass (PSG), for example, which is subsequently released. The bottom electrode 307 may be applied to the top surface of the substrate 305 and the sacrificial material initially filling the cavity 315, and the top electrode 301 may be applied to the top surface of the piezoelectric layer 308, respectively, using a spin-on, sputtering, evaporation or chemical vapor disposition (CVD) technique, for example, to the desired thickness.

The piezoelectric layer 308 is a combination of undoped piezoelectric material and doped piezoelectric material, where the doped piezoelectric material may be doped with at least one rare earth element. Combining the undoped and doped piezoelectric material improves piezoelectric properties of the piezoelectric layer 308, such as increasing the coupling coefficient $kt^2$ over that of an entirely undoped piezoelectric material. At the same time, the undoped and doped piezoelectric material reduces and more evenly distributes stress in the piezoelectric layer 308, thereby reducing total compressive stress and more evenly distributing compressive stress over the substrate 305.

In the depicted embodiment, the piezoelectric layer 308 includes first sub-layer 308-1 and second sub-layer 308-2, stacked in this order on the bottom electrode 307. The first and second sub-layers 308-1 and 308-2 are formed in separate processing steps to collectively provide the piezoelectric layer 308. The first sub-layer 308-1 is formed of undoped piezoelectric material, such as standard stoichiometric AlN, while the second sub-layer 308-2 is formed of doped piezoelectric material, such as AlN doped with at least one of Sc or Y, for example. Alternatively, the first sub-layer 308-1 may be formed of the doped piezoelectric material and the second sub-layer 308-2 may be formed of the undoped piezoelectric material. Of course, other piezoelectric materials and/or other rare earth elements or combinations of two or more rare earth elements may be incorporated in the first and second sub-layers 308-1 and 308-2, without departing from the scope of the present teachings. Generally, the stress state of each of the first and second sub-layers 308-1 and 308-2 may be "tuned" to result in the overall acoustic stack 310 having a stress level compatible with other manufacturing steps, as well as having an acceptable cross wafer stress value, e.g., as discussed below with regard to Table 1. In addition, the thickness of each the first and second sub-layers 308-1 and 308-2 may be varied to provide a desired coupling coefficient $kt^2$.

According to various embodiments, the piezoelectric layer 308 may have a total layer thickness of approximately 5000 Å to approximately 25000 Å, and each of the first and second sub-layers 308-1 and 308-2 may constitute about half the total thickness, thus having a sub-layer thickness of approximately 2500 Å to approximately 12500 Å, for example. The respective thicknesses of the first and second sub-layers 308-1 and 308-2 may vary to any proportions, resulting in different properties. For example, assuming that the first sub-layer 308-1 is formed of undoped piezoelectric material and the second sub-layer 308-2 is formed of doped piezoelectric material, when the first sub-layer 308-1 is thicker than the second sub-layer 308-2 (e.g., 75 percent first sub-layer 308-1 and 25 percent second sub-layer 308-2), the resulting piezoelectric layer 308 generally has lower and more evenly distributed compressive stress, but has less improvement in coupling coefficient $kt^2$ over a piezoelectric layer formed entirely of undoped piezoelectric material. In comparison, when the first sub-layer 308-1 is thinner than the second sub-layer 308-2 (e.g., 25 percent first sub-layer 308-1 and 75 percent second sub-layer 308-2), the resulting piezoelectric layer 308 experiences greater improvement in coupling coefficient $kt^2$, but has higher and less evenly distributed compressive stress.

Likewise, according to various embodiments, the atomic percentage of the rare earth element(s) in the doped piezoelectric material may be varied to affect properties of the piezoelectric layer 380. For example, assuming that the first sub-layer 308-1 is formed of undoped piezoelectric material and the second sub-layer 308-2 is formed of doped piezoelectric material, the higher the concentration of the rare earth element in the second sub-layer 308-2, e.g., from about 0.5 atomic percent of the piezoelectric material up to about 40 atomic percent of the piezoelectric material, the greater the improvement in coupling coefficient $kt^2$ of the piezoelectric layer 308 over a piezoelectric layer formed entirely of undoped piezoelectric material. However, the compressive stress is higher and less evenly distributed as the atomic percentage of the rare earth element increases. Notably, when the atomic percentage of the rare earth element is relatively high in a thin second sub-layer 308-2, e.g., in a range of about 30 atomic percent to about 40 atomic percent, the resulting piezoelectric layer 308 may have a desirable balance between improved coupling coefficient $kt^2$ and improved compressive stress characteristics. For example, the first sub-layer 308-1 may be considerably thicker than the second sub-layer 308-2 (e.g., 90 percent first sub-layer 308-1 and 10 percent second sub-layer 308-2) to provide very low and evenly distributed compressive stress, while the second sub-layer 308-2 may have a relatively large atomic percentage of a rare earth element (e.g., about 40 atomic percent) to still provide improved coupling coefficient $kt^2$. Or, the first sub-layer 308-1 and the second sub-layer 308-2 may have about the same thickness to provide improved compressive stress characteristics, while the second sub-layer 308-2 may have a relatively small atomic percentage of a rare earth element (e.g., less than about 10 atomic percent) to provide improved coupling coefficient $kt^2$. Generally, the atomic percentage of the rare earth element(s) varies inversely to the thickness of the sub-layer comprising the doped piezoelectric material in order to provide the desired balance between compressive stress and coupling coefficient $kt^2$. Of course, the balance between compressive stress and coupling coefficient $kt^2$ may be varied to provide unique benefits for any particular situation or to meet application specific design requirements of various implementations, as would be apparent to one skilled in the art.

When the doped piezoelectric material in the piezoelectric layer 308 comprises doped AlN, a number of Al atoms within the AlN crystal lattice are replaced with a rare earth element at a predetermined percentage, referred to as a "doping element." In alternative configurations, a number of Al atoms within the AlN crystal lattice may be replaced with more than one type of rare earth element at predetermined percentages, respectively. Because the doping elements replace only Al atoms (e.g., of an Al target), the percentage of nitrogen atoms in the piezoelectric material remains substantially the same regardless of the amount of doping. When percentages of doping elements are discussed herein, it is in reference to the total atoms (including nitrogen) of the AlN piezoelectric material. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

According to various alternative embodiments, the undoped and doped piezoelectric material may be included in a piezoelectric layer in a number of ways. For example, the piezoelectric layer may be formed of one undoped sub-layer formed of undoped piezoelectric material and one doped sub-layer formed of doped piezoelectric material, as discussed above with reference to FIG. 3B. Alternatively, the piezoelectric layer may include multiple undoped sub-layers formed of undoped piezoelectric material and/or multiple doped sub-layers formed of undoped piezoelectric material. Further, the piezoelectric layer may include no sub-layers, in which case the piezoelectric layer is a single layer of piezoelectric material having undoped and doped portions, formed by varying the amount of doping during the formation process, as discussed below.

Figure 4A:
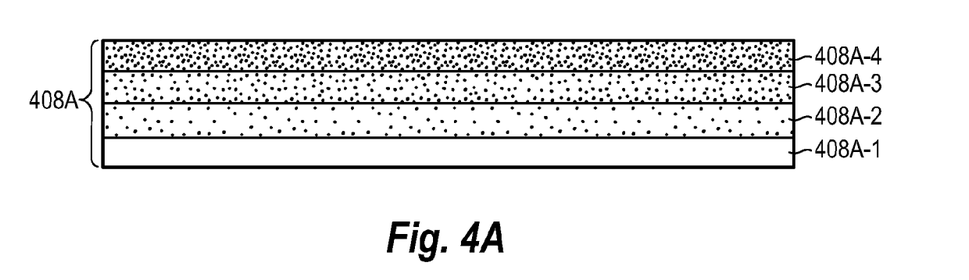
FIGS. 4A and 4B are cross-sectional views of piezoelectric layers formed of undoped and doped portions, in accordance with alternative representative embodiments.
Figure 4B:
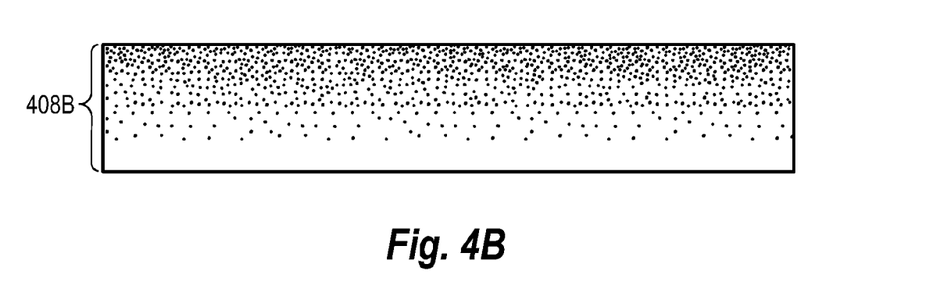

FIG. 4A shows a cross-sectional view of piezoelectric layer 408A, formed of more than two sub-layers of undoped and/or doped piezoelectric materials, in accordance with a representative embodiment. FIG. 4B shows a cross-sectional view of piezoelectric layer 408B, formed of a single layer having varying amounts of dopants within the piezoelectric material, in accordance with another representative embodiment. The piezoelectric layers 408A and 408B may be included in the acoustic stack 310 in place of the piezoelectric layer 308, discussed above.

Referring to FIG. 4A, the piezoelectric layer 408A includes representative first sub-layer 408A-1, second sub-layer 408A-2, third sub-layer 408A-3, and fourth sub-layer 408A-4, stacked in this order on a bottom electrode, such as the bottom electrode 307. The first through fourth sub-layers 408-1 to 408-4 are formed in separate processing steps to provide collectively the piezoelectric layer 408A. At least one of the first through fourth sub-layers 408-1 to 408-4 is formed of undoped piezoelectric material, such as AlN, and at least another one of the first through fourth sub-layers 408-1 to 408-4 is formed of doped piezoelectric material, such as AlScN. As an example, the first sub-layer 408-1 may be formed of undoped AlN material, while the second through fourth sub-layers 408-2 to 408-4 may be formed of AlN material doped with varying atomic percentages of Sc. For example, the second through fourth sub-layers 408-2 to 408-4 may be formed of doped AlN material having incrementally increasing atomic percentages of the Sc, where the second sub-layer 408-2 has the lowest atomic percentage of Sc and the fourth sub-layer 408-4 has the highest atomic percentage of Sc. This is indicated schematically by the increasing density of dots in the second through fourth sub-layers 408-2 to 408-4 of the piezoelectric layer 408A, respectively.

Of course, in alternative configurations, the second through fourth sub-layers 408-2 to 408-4 may be formed of doped AlN material having incrementally decreasing atomic percentages of Sc, or atomic percentages of Sc that are simply different from one another without necessarily increasing or decreasing. As another example, the first through fourth sub-layers 408-1 to 408-4 may alternate between undoped AlN material and doped AlN material, such as AlScN, where the undoped AlN material (e.g., in second and fourth sub-layers 408-2 and 408-4) may have the same or different atomic percentages of Sc. The numbers of sub-layers, as well as the number and types of dopants, may vary without departing from the scope of the present teachings. For example, multiple doped sub-layers may include piezoelectric material doped with different rare earth elements from one another, piezoelectric material doped with different atomic percentages of the same or different rare earth elements, or doped and/or undoped sub-layers may include different piezoelectric materials.

Referring to FIG. 4B, the piezoelectric layer 408B includes a single layer having representative undoped and doped portions, formed on a bottom electrode, such as the bottom electrode 307. The piezoelectric layer 408B is formed in a single processing step, in which the amount of doping is adjusted in the course of the processing step. That is, the piezoelectric layer 408B includes a single layer of variously doped piezoelectric material, such as AlN, having varying atomic percentages of at least one rare earth element, such as Sc and/or Y, over a thickness of the piezoelectric layer 408B. A portion of the piezoelectric material in the piezoelectric layer 408B is undoped. For example, as indicated in FIG. 4B, the piezoelectric layer 408B may be formed of undoped AlN material at the bottom of the piezoelectric layer 408B and doped AlN material having incrementally increasing atomic percentages of the Sc provided throughout the formation process, resulting in a relatively small atomic percentage of Sc near the bottom of the piezoelectric layer 408B (immediately above the undoped AlN material portion) and a relatively large atomic percentage of Sc at the top of the piezoelectric layer 408B. The piezoelectric material thus includes incrementally increasing atomic percentages of the Sc over the thickness of the piezoelectric layer 408B. This is indicated schematically by the increasing density of dots toward the top of the piezoelectric layer 408B.

Of course, in alternative configurations, the piezoelectric layer 408B may be formed of doped AlN material having incrementally decreasing atomic percentages of the Sc throughout the formation process, resulting in a relatively large atomic percentage of Sc near the bottom of the piezoelectric layer 408B and a relatively large atomic percentage of Sc at the top of the piezoelectric layer 408B. The piezoelectric material thus includes incrementally decreasing atomic percentages of the Sc over the thickness of the piezoelectric layer 408B. Also, in a configuration having an incrementally decreasing atomic percentage of Sc, the undoped AlN material portion of the piezoelectric layer 408B may be located at the top of the piezoelectric layer 408B. As another example, the atomic percentages of Sc may vary throughout the piezoelectric layer 408B, i.e., without necessarily increasing or decreasing in relation to the thickness of the piezoelectric layer 408B. The degrees of doping, as well as the number and types of dopants, may vary without departing from the scope of the present teachings.

Figure 5:
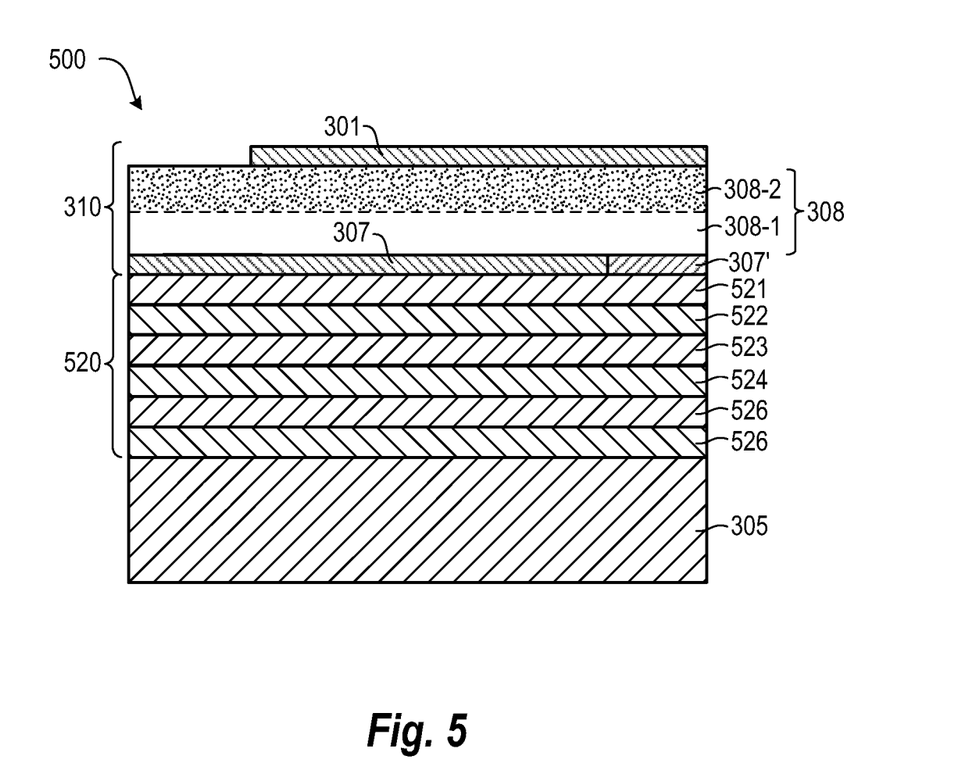
FIG. 5 is a cross-sectional view of a solidly mounted resonator (SMR) having a piezoelectric layer formed of undoped and doped sub-layers, in accordance with a representative embodiment.

FIG. 5 shows a cross-sectional view of SMR 500 in accordance with a representative embodiment. The various elements of the SMR 500 are substantially the same as the corresponding elements discussed above with reference to the FBAR 300 in FIG. 3B, above, except that the SMR 500 includes acoustic reflector 520 formed over the substrate 305 in place of the cavity 306 to provide acoustic isolation. The acoustic reflector 520 may be a distributed Bragg reflector (DBR) or other acoustic mirror, for example, formed of multiple acoustic impedance layers, indicated by representative first through sixth acoustic impedance layers 521 to 526. The first or bottom electrode 307 and the planarization layer 307' are disposed over the acoustic reflector 520, the piezoelectric layer 308 is disposed over the bottom electrode 307, and the second or top electrode 301 is disposed over the piezoelectric layer 308. The piezoelectric layer 308 includes first and second sub-layers 308-1 and 308-2, one of which is formed of undoped piezoelectric material and the other of which is formed of doped piezoelectric material. Alternative arrangements of undoped and doped piezoelectric materials may be incorporated in place of piezoelectric layer 308, such as those discussed above in regard to piezoelectric layers 408A and 408B. As should be appreciated by one of ordinary skill in the art, the structure provided by the bottom electrode 307, the piezoelectric layer 308 and the top electrode 301 forms the acoustic stack 310 of a BAW resonator.

More particularly, the acoustic reflector 520 is grown on the top of the substrate 305 and provides acoustic isolation between the substrate 305 and the acoustic stack 310. The acoustic impedance layers 521 to 526 of the acoustic reflector 520 are formed of materials having different acoustic impedances. For example, the acoustic impedance layers 521 to 526 may have alternating low and high acoustic impedances, such that acoustic impedance layer 521 has relatively low acoustic impedance, acoustic impedance layer 522 has relatively high acoustic impedance, acoustic impedance layer 523 has relatively low acoustic impedance, acoustic impedance layer 524 has relatively high acoustic impedance, acoustic impedance layer 525 has relatively low acoustic impedance, and acoustic impedance layer 526 has relatively high acoustic impedance. These differing acoustic impedances can be obtained, for instance, by forming the odd numbered acoustic impedance layers 521, 523 and 525 of a relatively soft material, and forming the even numbered acoustic impedance layers 522, 524 and 526 of a relatively hard material. Notably, the number of acoustic impedance layers may differ from six, without departing from the scope of the present teachings. Generally, the number of acoustic impedance layers may be determined by a tradeoff between desired mirror performance (e.g., the more layers the better) and cost and processing issues (e.g., the fewer layers the cheaper and more straightforward mirror growth and post-processing).

The amount of acoustic isolation provided by acoustic reflector 520 generally depends on the contrast between the acoustic impedances of adjacent acoustic impedance layers 521 to 526, with a greater amount of contrast creating better acoustic isolation. In some embodiments, the acoustic reflector 520 is formed in pairs of dielectric materials having contrasting acoustic impedances. For example, the odd acoustic reflector layers 521, 523 and 525 may be formed of a material having low acoustic impedance, such as silicon oxide ($SiO_x$), where x is an integer, while the even acoustic reflector layers 522, 524 and 526, paired with corresponding odd acoustic reflector layers 521, 523 and 525, may be formed of a material having high acoustic impedance, such as tungsten (W) or molybdenum (Mo). In another example, the odd acoustic reflector layers 521, 523 and 525 may be formed of carbon-doped silicon oxide (CDO), while the even acoustic reflector layers 522, 524 and 526, paired with corresponding odd acoustic reflector layers 521, 523 and 525, may be formed of silicon nitride ($SiN_x$), where x is an integer. A benefit of this pair is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. This process may be less expensive (e.g., by about 10 percent) than producing an etched air cavity, for example, thus providing a cost effective substitute for an air cavity.

The acoustic reflector 520 may be fabricated using various alternative techniques, an example of which is described in U.S. Pat. No. 7,358,831 to Larson, III et al., which is hereby incorporated by reference in its entirety. Of course, the low and high acoustic impedance materials forming the stacked layers of the acoustic reflector 520 may vary without departing from the scope of the present teachings. The present teachings contemplate the use of FBARs (e.g., FBAR 300) or SMRs (e.g., SMR 500) in a variety of applications, including filters (e.g., ladder filters comprising a plurality of BAW resonators).

For purposes of illustration, the undoped sub-layer (e.g., first sub-layer 308-1) of the piezoelectric layer 308 may be formed of AlN, and the doped sub-layer (e.g., second sub-layer 308-2) of the piezoelectric layer 308 may be formed of AlN doped with Sc. For example, for the first sub-layer 308-1, Al may be sputtered onto a seed layer grown on a top surface of the bottom electrode 307, or sputtered directly on the top surface of the bottom electrode 307, in the presence of an argon (Ar)-nitrogen ($N_2$) gas atmosphere inside a reaction chamber. The top surface of the bottom electrode 307 may be previously cleaned using Ar and/or hydrogen ($H_2$) gas. For the second sub-layer 308-2, combined aluminum and scandium may be sputtered directly on the top surface of the first sub-layer 308-1, also in the presence of the Ar—$N_2$ gas atmosphere inside the reaction chamber. More particularly, in various embodiments, a composite target (or multiple targets) formed of Al and desired proportion of Sc (thus effectively forming an Al—Sc alloy) is provided in the reaction chamber. Application of AC power creates Ar—$N_2$ plasma with which the target reacts, resulting in sputter deposition of nitrogen, aluminum and scandium atoms in proportionate amounts to the top surface of the first sub-layer 308-1). Examples of general AlN sputter deposition processes are provided by U.S. Patent App. Pub. No. 2011/0180391 to Larson, III et al., published on Jul. 28, 2011, which is hereby incorporated by reference in its entirety.

In an embodiment, the target (or multiple targets) formed of Al with the desired proportion(s) of rare earth element(s) may be a previously formed alloy of Al and the rare earth element(s) mixed in the desired proportions. In an alternative embodiment, the target may be a composite target formed of substantially of Al, and the rare earth element(s) are introduced by forming holes in the aluminum target and inserting "plugs" of the rare earth element(s) into the respective holes in the desired proportions. The percentage of each rare earth element corresponds to the collective volume of that element inserted into one or more respective holes, which displaces a corresponding volume of aluminum. The size and number of holes, as well as the amount of the rare earth element filling each of the holes, may be determined on a case-by-case basis, depending on the desired percentages of doping. For example, the holes may be drilled partially or entirely through the aluminum target in the desired sizes and numbers in various patterns. Similarly, in alternative embodiments, the rare earth element(s) may be added to the Al target in the desired proportion using various alternative types of insertions, without departing from the scope of the present teachings. For example, full or partial rings formed of the rare earth element(s), respectively, may be inlaid in each Al target. The number, width, depth and circumference of each ring may be adjusted to provide the desired proportion of each particular element.

In alternative embodiments, the Al and doping rare earth elements may be sputtered directly on the top surface of the first sub-layer 308-1 using multiple targets formed of the different elements, respectively. For example, an Al—Sc—Y alloy may be applied using an Al target, an Sc target and a Y target separately reacting to the Ar—$N_2$ plasma. The desired proportions of the elements (e.g., the Al and the rare earth element dopants) may be obtained by varying the AC power applied to each of the targets and/or the sizes of the targets in relation to one another. Of course, any other process for applying rare earth elements in desired proportions to form a doped piezoelectric layer may be used without departing from the scope of the present teachings.

Generally, the Al and N are proportioned at approximately 50 percent each (i.e., the overall atomic percentage of the Al is approximately 50). The Sc atoms and other rare earth elements, for example, replace Al atoms (in the AlN crystal lattice), while the proportionate amount of nitrogen stays substantially the same. So, for example, the Al target may contain about 5 percent Sc, in which case the Al in the doped second sub-layer 308-2 of the piezoelectric layer 308 has an atomic percentage of approximately 47.5, while the Sc has an atomic percentage of approximately 2.5. The atomic consistency of the second sub-layer 308-2 of the piezoelectric layer 308 may then be represented as $Al_{0.475}Sc_{0.025}N_{0.50}$, for example.

In various embodiments, the amount of the Sc dopant and/or the Y dopant present in the doped portion of the piezoelectric layer 308 may be less than approximately ten atomic percent each, for example. Also, in various embodiments, the amount the Sc dopant and/or the Y dopant present in the doped portion of the piezoelectric layer 308 may be less than approximately one atomic percent each, for example. Although described with reference to AlN doped with Sc and/or Y, it is understood that the doped portion may be doped with one or more other rare earth elements in substantially the same manner, without departing from the scope of the present teachings. Also, the general concept of doping a portion of the piezoelectric layer 308 with a rare earth element may be applied to other piezoelectric materials, such as zinc oxide (ZnO) or lead zirconate titanate (PZT), without departing from the scope of the present teachings.

Table 1 shows the effectiveness of reducing overall stress and cross-wafer stress variation of an AlN thin film by including an undoped and doped portions in the piezoelectric layer, as shown for example by piezoelectric layer 308. More particularly, Table 1 compares stress levels of a piezoelectric layer formed entirely of AlN material doped with Sc and a piezoelectric layer formed of a first sub-layer of undoped AlN material and a second sub-layer of the AlN material doped with Sc (at the same atomic percentage). Table 1 further compares stress levels of a piezoelectric layer formed entirely of AlN material doped with Y and a piezoelectric layer formed of a first sub-layer of undoped AlN material and a second sub-layer of the AlN material doped with Y (at the same atomic percentage).

TABLE 1

| Piezoelectric Layer Material | Average Stress (MPa) | Min Stress (MPa) | Max Stress (MPa) | Standard Deviation |
|---|---|---|---|---|
| AlScN only | 541 | 363 | 694 | 127 |
| AlN/AlScN sub-layers | 117 | −2 | 326 | 72 |
| AlYN only | −772 | −383 | −1147 | 230 |
| AlN/AlYN sub-layers | 198 | 118 | 333 | 45 |

Referring to Table 1, with regard to Sc doping in the entire AlN thin film (AlScN only), average stress is 541 MPa and standard deviation across the wafer is 127 MPa, both of which are relatively large values. Utilizing "six sigma" principles for the standard deviation, the overall stress range across the wafer is about +/−390 MPa. As discussed above, the coupling coefficient $kt^2$ of the doped AlN film increases linearly by about 0.1 percent for every 100 MPa increase in stress. Accordingly, the AlN thin film would exhibit an approximately 0.8 percent variation of the coupling coefficient $kt^2$ across the wafer. In comparison, the multiple sub-layer AlN thin film (AlN/AlScN), where one of the sub-layers is formed of undoped AlN material, has an average stress of 117 MPa and a standard deviation across the wafer of 72 MPa. The overall stress range across the wafer is therefore about +/−225 MPa, which equates to only an approximately 0.4 percent variation of the coupling coefficient $kt^2$ across the wafer. A lower variation in the coupling coefficient $kt^2$ across the wafer means more of the wafer will meet the electrical specifications of the product, resulting in higher manufacturing yield, for example.

Similarly, with regard to Y doping of the entire AlN thin film (AlYN only), average stress is −772 MPa and standard deviation across the wafer is 230 MPa, both of which are relatively large values. The overall stress range across the wafer is therefore about +/−690 MPa. Accordingly, the AlN thin film would exhibit an approximately 1.4 percent variation of the coupling coefficient $kt^2$ across the wafer. In comparison, the multiple sub-layer AlN thin film (AlN/AlYN) has an average stress of 198 MPa and a standard deviation across the wafer of 45 MPa. The overall stress range across the wafer is therefore about +/−135 MPa, which equates to only an approximately 0.3 percent variation of the coupling coefficient $kt^2$ across the wafer. The advantage of using the multiple sub-layer AlN thin film is therefore even more pronounced when using Y as the dopant.

Figure 6:
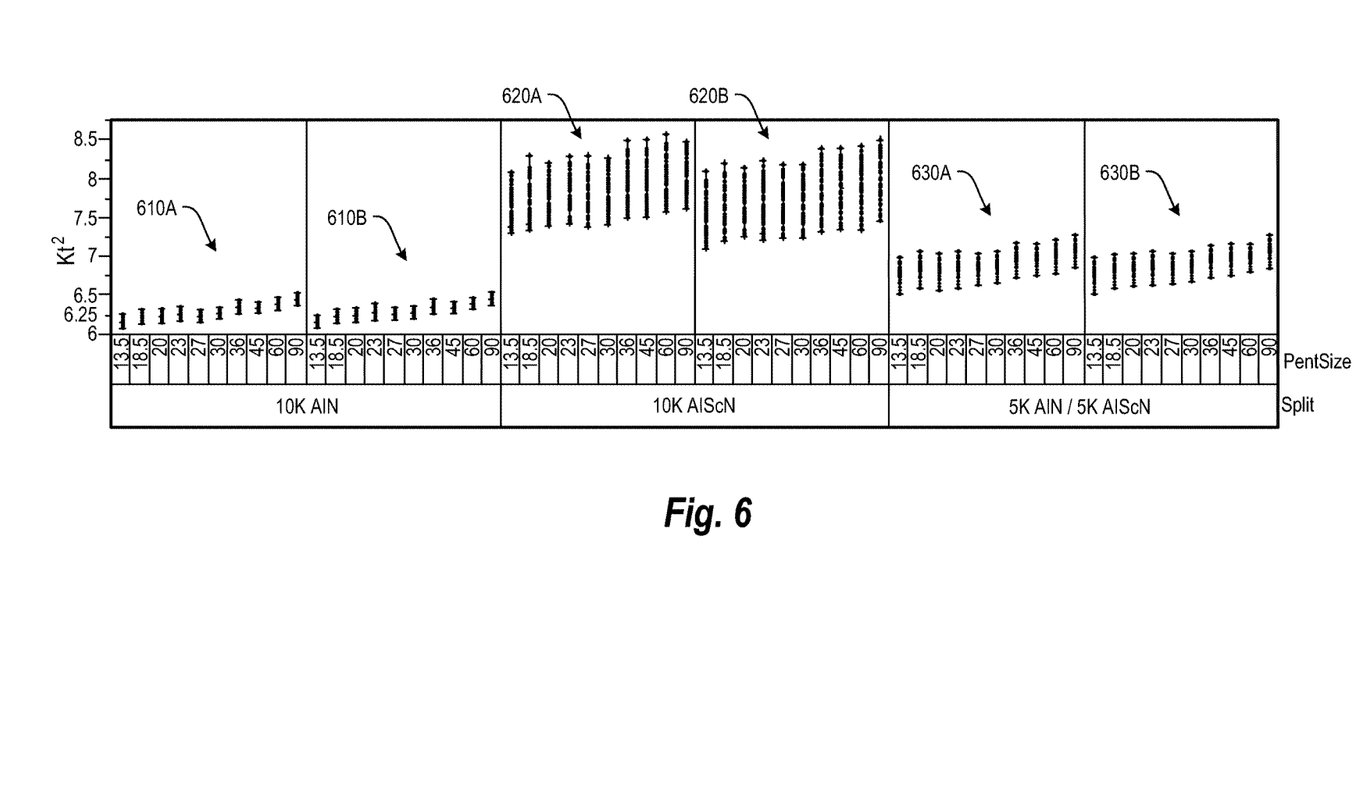
FIG. 6 is a graph showing traces depicting coupling coefficients of piezoelectric layers for purposes of comparison, in accordance with a representative embodiment.

FIG. 6 is a graph showing traces depicting coupling coefficients of piezoelectric layers with variations in doping, in accordance with a representative embodiment.

Referring to FIG. 6, six sets of traces are shown for purposes of comparison corresponding to six sets of samples. "PentSize" refers to the size, in square microns, of the pentagon shaped resonator of each sample (e.g., as shown in FIG. 3A), and "Split" refers to the construction of piezoelectric layers or sub-layers of each set of samples. Notably, the six sample sets are grouped into three pairs of traces, where the samples in each pair have substantially the same construction and are tested under substantially the same conditions in order to establish repeatability. The first pair includes trace sets 610A and 610B, in which the sample resonators have piezoelectric layers formed entirely of a single layer of undoped AlN having a thickness of about 10,000 Å. The second pair includes trace sets 620A and 620B, in which the resonators have piezoelectric layers formed entirely of a single layer of AlN doped with Sc (AlScN) having a thickness of about 10,000 Å. The third pair includes trace sets 630A and 630B, in which the resonators have piezoelectric layers formed of a sub-layer of undoped AlN having a thickness of about 5,000 Å and a sub-layer of doped AlScN having a thickness of about 5,000 Å.

Trace sets 610A and 610B show coupling coefficients $kt^2$ for a piezoelectric layer formed entirely of undoped AlN material ranging from about 6.1 to about 6.5, with the larger samples being slightly higher. Trace sets 620A and 620B show coupling coefficients $kt^2$ for a piezoelectric layer formed entirely of AlN material doped with approximately 2.5 atomic percent Sc ranging from about 7.2 to about 8.5, with the larger samples being slightly higher. Trace sets 630A and 630B show coupling coefficient $kt^2$ for a piezoelectric layer having a first sub-layer formed of undoped AlN material and a second sub-layer formed of AlN material doped with approximately the same atomic percent Sc, according to a representative embodiment, ranging from about 6.5 to about 7.2, with the larger samples being slightly higher.

As compared to trace sets 610A/610B, trace sets 620A/620B and trace sets 630A/630B show improvement in electrical performance of the piezoelectric layer from the perspective of increased absolute value distributions of the coupling coefficient $kt^2$ due to doping the AlN material with Sc. Indeed, trace sets 620A/620B show that the highest increase in coupling coefficient $kt^2$ is achieved using the piezoelectric layer formed entirely of the doped AlN material. However, trace sets 620A/620B also show the largest variation in coupling coefficient $kt^2$ values across the wafer (indicated by the length of each trace), having a spread of approximately 1 percent, which results from the increased stress levels caused by doping. In comparison, trace sets 630A/630B show about a 50 percent reduction in coupling coefficient $kt^2$ variation across the wafer, having a spread of only about 0.5 percent, while still providing appreciable improvement in absolute value distributions of the coupling coefficient $kt^2$ over the piezoelectric material formed only of undoped AlN, shown by trace sets 610A/610B. Accordingly, the piezoelectric layer consisting of both undoped and doped portions of AlN material, via multiple sub-layers (e.g., FIGS. 3B and 4A) or by varying doping amounts within a single layer (e.g., FIG. 4B), provides a desirable balance between increased coupling coefficient $kt^2$ and consistency across the wafer.

Notably, piezoelectric layers consisting of both undoped and doped portions of piezoelectric material have been discussed herein with reference to BAW resonator devices, including FBARs and SMRs, as examples. However, it is understood that such piezoelectric layers may be formed in resonator stacks of various other types of resonator devices, without departing from the scope of the present teachings. For example, piezoelectric layers consisting of undoped and doped portions of piezoelectric material may be formed in resonator stacks of a stacked bulk acoustic resonator (SBAR) device, a double bulk acoustic resonator (DBAR) device, or a coupled resonator filter (CRF) device.

One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
   a first electrode disposed over a substrate;
   a piezoelectric layer disposed over the first electrode, the piezoelectric layer comprising a single layer, which comprises: a doped piezoelectric material, and an undoped piezoelectric material, wherein the doped piezoelectric material is variously doped at varying atomic percentages of at least one rare earth element for improving piezoelectric properties of the piezoelectric layer and reducing compressive stress; and
   a second electrode disposed over the piezoelectric layer.

2. The BAW resonator structure according to claim 1, wherein the piezoelectric layer comprises aluminum nitride (AlN).

3. The BAW resonator structure according to claim 2, wherein the at least one rare earth element comprises at least one of scandium (Sc) and yttrium (Y).

4. The BAW resonator structure according to claim 2, wherein a concentration of each of the at least one rare earth element is less than approximately 10 atomic percent of the doped piezoelectric material.

5. The BAW resonator structure according to claim 2, wherein a concentration of each of the at least one rare earth element is in a range of approximately 30 atomic percent to approximately 40 atomic percent of the doped piezoelectric material.

6. The BAW resonator structure according to claim 1, wherein the doped piezoelectric material has an incrementally increasing atomic percentage of the at least one rare earth element in a direction away from the substrate.

7. The BAW resonator structure according to claim 1, wherein the doped piezoelectric material has an incrementally decreasing atomic percentage of the at least one rare earth element in a direction away from the substrate.

8. A thin film bulk acoustic resonator (FBAR) structure, comprising:
- a substrate defining a cavity;
- a first electrode disposed over the substrate, at least a portion of the first electrode being formed over the cavity in the substrate;
- a single piezoelectric layer disposed over the first electrode, the single piezoelectric layer comprising: an undoped portion comprising undoped aluminum nitride (AlN) material; and a doped portion comprising doped AlN material, the doped portion being doped with a rare earth element; and
- a second electrode disposed over the single piezoelectric layer.

9. The FBAR structure according to claim 8, wherein the rare earth element comprises either scandium (Sc) and yttrium (Y).

10. The FBAR structure according to claim 8, wherein a concentration of the rare earth element is less than approximately 10 atomic percent of the doped AlN material.

11. The FBAR structure according to claim 8, wherein a concentration of each of the rare earth element is in a range of approximately 30 atomic percent to approximately 40 atomic percent of the doped AlN material.

12. A solidly mounted resonator (SMR) structure, comprising:
- a substrate;
- an acoustic reflector formed on the substrate, the acoustic reflector comprising a plurality of acoustic impedance layers, wherein at least two of the acoustic impedance layers have different acoustic impedances;
- a first electrode disposed over the acoustic reflector;
- a single piezoelectric layer disposed over the first electrode, the single piezoelectric layer comprising: an undoped portion comprising undoped aluminum nitride (AlN) material; and a doped portion comprising doped AlN material, the doped portion being doped with a rare earth element; and
- a second electrode disposed over the single piezoelectric layer.

13. The SMR structure according to claim 12, wherein the rare earth element comprises either scandium (Sc) and yttrium (Y).

14. The SMR structure according to claim 12, wherein a concentration of the rare earth element is less than approximately 10 atomic percent of the doped AlN material.

15. The SMR structure according to claim 12, wherein a concentration of each of the rare earth element is in a range of approximately 30 atomic percent to approximately 40 atomic percent of the doped AlN material.

16. A thin film bulk acoustic resonator (FBAR) structure, comprising:
- a substrate defining a cavity;
- a first electrode disposed over the substrate, at least a portion of the first electrode being formed over the cavity in the substrate;
- a piezoelectric layer disposed over the first electrode, the piezoelectric layer comprising: an undoped sub-layer comprising undoped aluminum nitride (AlN) material; a first doped sub-layer comprising a first doped AlN material, the first doped AlN material being doped with a first atomic percentage of a first rare earth element; a second doped sub-layer comprising a second doped AlN material, the second doped AlN material being doped with a second atomic percentage of a second rare earth element, the second atomic percentage being different from the first atomic percentage; and
- a second electrode disposed over the piezoelectric layer.

17. The FBAR structure according to claim 16, wherein the first rare earth element comprises either scandium (Sc) and yttrium (Y).

18. The FBAR structure according to claim 16, wherein a concentration of the first rare earth element is less than approximately 10 atomic percent of the first doped AlN material.

19. The FBAR structure according to claim 16, wherein a concentration of the second rare earth element is less than approximately 10 atomic percent of the second doped AlN material.

20. The FBAR structure according to claim 16, wherein a concentration of the first rare earth element is in a range of approximately 30 atomic percent to approximately 40 atomic percent of the first doped AlN material.

21. The FBAR structure according to claim 16, wherein a concentration of the second rare earth element is in a range of approximately 30 atomic percent to approximately 40 atomic percent of the second doped AlN material.

* * * * *